United States Patent
Kern et al.

(10) Patent No.: US 7,394,982 B2
(45) Date of Patent: Jul. 1, 2008

(54) CURRENT SENSING SYSTEM

(75) Inventors: John Michael Kern, Rexford, NY (US); Glen Peter Koste, Niskayuna, NY (US); Charles Erklin Seeley, Niskayuna, NY (US); Todd Ryan Tolliver, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 535 days.

(21) Appl. No.: 10/871,196

(22) Filed: Jun. 17, 2004

(65) Prior Publication Data

US 2005/0281560 A1    Dec. 22, 2005

(51) Int. Cl.
*H04B 10/08* (2006.01)

(52) U.S. Cl. .............................. 398/33; 398/85; 398/108

(58) Field of Classification Search ............. 398/30–33, 398/82–87, 107–108
See application file for complete search history.

(56) References Cited

U.S. PATENT DOCUMENTS

| | | | |
|---|---|---|---|
| 3,324,393 A | * | 6/1967 | Casey et al. .................... 324/96 |
| 5,380,995 A | | 1/1995 | Udd et al. |
| 6,670,799 B1 | | 12/2003 | Bull et al. |
| 2003/0141440 A1 | | 7/2003 | Kim et al. |

FOREIGN PATENT DOCUMENTS

| | | |
|---|---|---|
| GB | 2 221 763 | 2/1990 |
| GB | 2 328 278 | 2/1999 |
| GB | 2328278 A * | 2/1999 |

OTHER PUBLICATIONS

Niewczas et al, "Design and Evaluation of a Pre-Prototype Hybrid Fiber-Optic Voltage Sensor for a Remotely Interrogated Condition Monitoring System", IMTC, May 2004.*
Pachecò et al. "Piezoelectric-modulated optica fibre Bragg grating high-voltage sensor", Meas. Sci. Technol. 10 (1999).*
Agilent, "Optical Spectrum Analysis", Printed in USA Sep. 2000.*
Niewczas et al. "Performance Analysis fo the Fiber Bragg Grating Interrogation System Based on an Arrayed WAveguide Grating", IEEE Instrumentation and Measurement, May 2003.*
Y.N. Ning, et al, "Interrogation of a Conventional Current Transformer by a Fiber-Optic Interferometer", Sep. 15, 1991, Optics Letters, vol. 16. No. 18, pp. 1448-1450.

(Continued)

*Primary Examiner*—Dzung D Tran
(74) *Attorney, Agent, or Firm*—Ann M. Agosti; Patrick K. Patnode

(57) ABSTRACT

A current sensing system comprises a current transformer; a burden resistor connected across a secondary of the current transformer; a piezo-optic sensor coupled to the burden resistor, comprising a piezoelectric transducer, an optical fiber and a first optical filter with a first bandwidth; and an optical interrogator, configured for sending an originating signal to the first bandwidth optical filter and receiving a resulting data signal and a second optical filter with a second bandwidth for filtering the resulting data signal.

42 Claims, 3 Drawing Sheets

OTHER PUBLICATIONS

C. McGarrity, et al. "A Fiber-Optic System for three—phase current sensing using a hybrid sensing technique", Mar. 1992, Rev. Sci. Instrum. vol. 63. No. 3, pp. 2035-2039.

Y.N. Ning, et al, "Recent Progress in Optical Current Sensing Techniques", May 1995, Rev. Sci. Instrum. vol. 66, No. 5, pp. 3097-3111.

N.E. Fisher, et al. "The interrogation of a Conventional Current Transformer using an in-fibre Bragg grating", 1997, Meas. Sci. Technol, vol. 8, pp. 1080-1084.

Wang Yutian, et al, "A new optically powered ultra voltage current transformer", 1998, SPIE, vol. 3555, C277-786x, pp. 13-17.

* cited by examiner

US 7,394,982 B2

CURRENT SENSING SYSTEM

BACKGROUND

The invention relates generally to current sensing systems. In particular, the invention relates to optically interrogated systems.

Measurement of currents flowing in high-voltage environments is highly desirable, especially in power transmission and distribution systems. Transmission systems react dynamically to changes in active and reactive power. For power transmission to be economical and the risk of power system failure to be low, reactive compensation systems are desirable, particularly systems capable of simultaneously monitoring current flow at several points on a grid.

High-voltage current transformers (CTs) are traditionally used in the utility industry to measure currents flowing on transmission lines at voltages up to 735 kV. Use of high-voltage CTs is very costly, ranging into the hundreds of thousands of dollars, because of the cost of large, oil-filled insulating columns that provide the mechanical support for a large current transformer and ensure sufficient dielectric insulation from measurement point to ground.

As an alternative to high-voltage current transformers, optical current sensors are sometimes used. Optical current sensors typically rely upon the Faraday effect, whereby the magnetic field created by the alternating current alters the polarization of light flowing in fiber near the conductor. The method for extracting this information from fiber is very intricate and costly. In one example complex, active power supplies are located at line potential. These supplies derive electrical power from the transmission line or a ground-based laser and provide power to electronics that actively sample, multiplex, and transmit optical digital signals over fiber to ground-potential equipment.

There is a need therefore for low cost high-voltage current metering and instrumentation. There is a particular need for a current measuring system that allows for multiplexing, which can be economically scaled and used in applications where instrumentation of multiple channels is required. Additionally, a completely passive current sensor, eliminating any need for auxiliary power circuits at the high-voltage level, is highly desirable in high-voltage equipment, where a sensor failure can require costly outages to allow for repair.

BRIEF DESCRIPTION

Briefly, in accordance with one embodiment of the present invention, a high voltage current measuring system comprises a current transformer (CT), a burden resistor connected across a secondary of the CT, a piezo-optic sensor coupled to the burden resistor, and an optical interrogator. The piezo-optic sensor comprises a piezoelectric transducer, an optical fiber and a first optical filter with a first bandwidth. The optical interrogator is configured for sending an originating signal to the first optical filter and receiving a resulting data signal and comprises a second optical filter with a second bandwidth for filtering the resulting data signal. The first bandwidth and the second bandwidth at least partially overlap.

In accordance with another embodiment of the present invention, multiple CTs are positioned on various points of a transmission network, burden resistors connected across secondary windings of the CTs are coupled to a piezo-optic sensor module, and an optical interrogator module is coupled to the piezo-optic sensor module.

DRAWINGS

These and other features, aspects, and advantages of the present invention will become better understood when the following detailed description is read with reference-to the accompanying drawings in which like characters represent like parts throughout the drawings, wherein.

DETAILED DESCRIPTION

Figure 1:
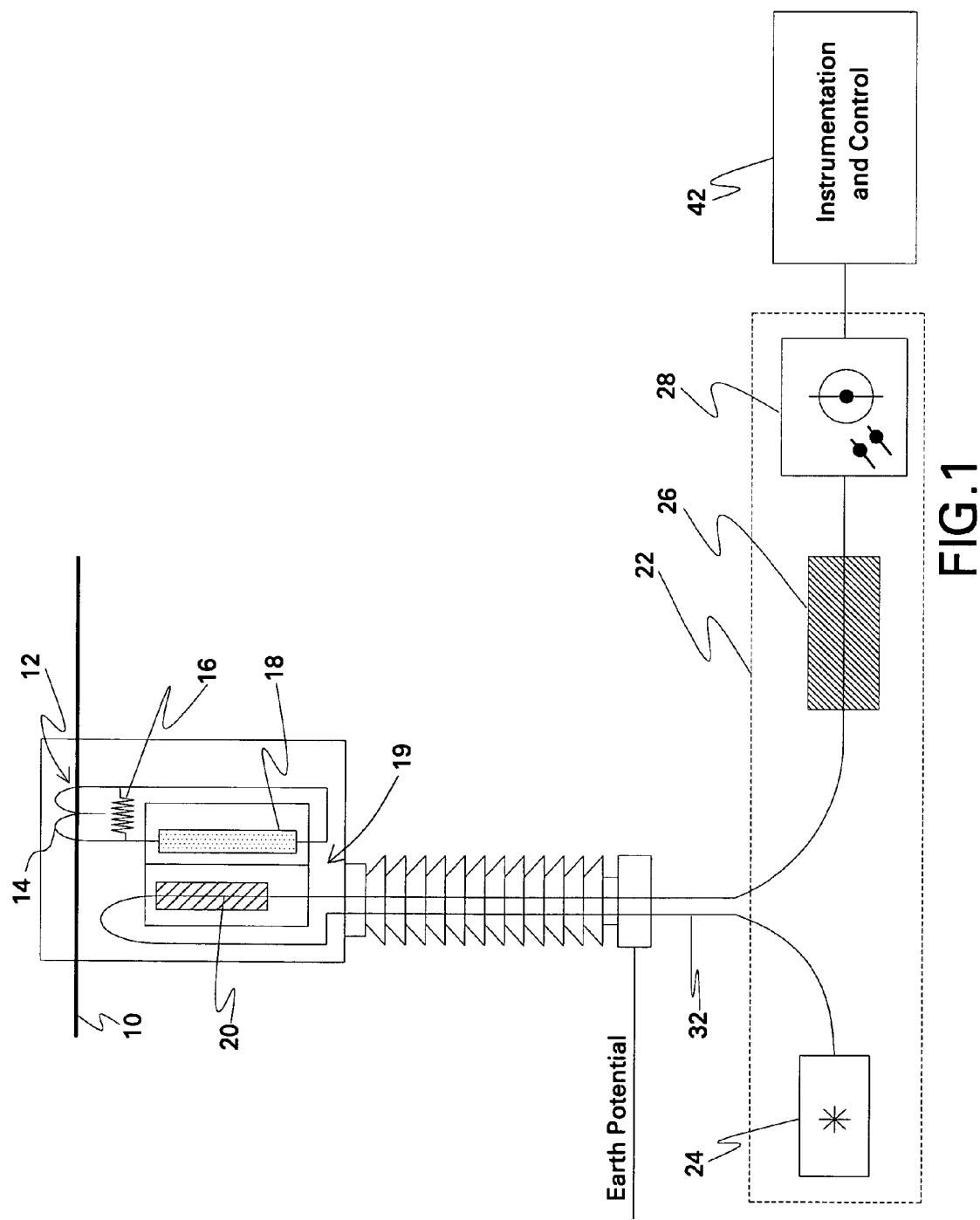
FIG. 1 is a schematic view of an optically interrogated current sensor in accordance with one embodiment of the present invention.
Figure 2:
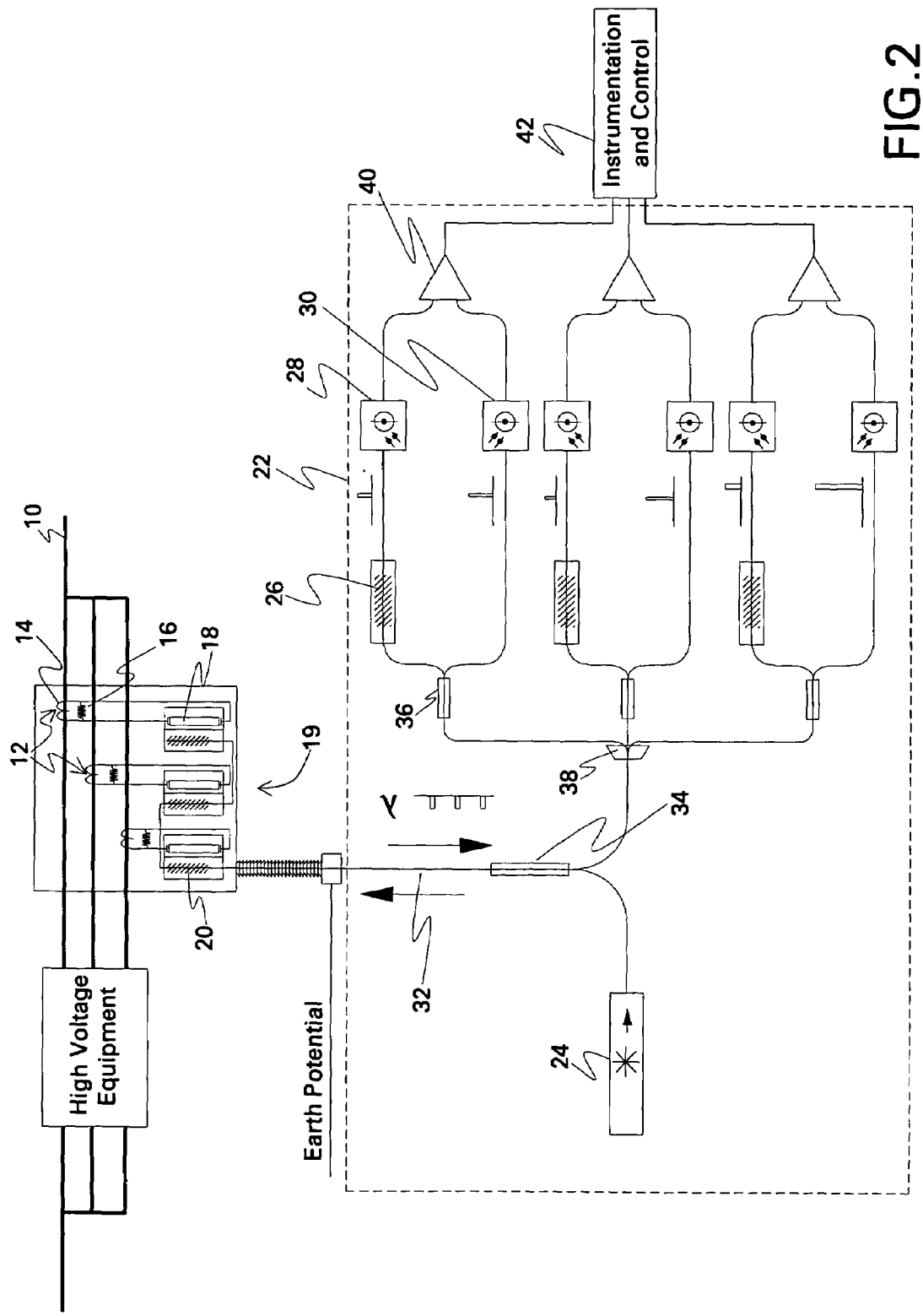
FIG. 2 is a schematic view of a multiplexed current sensor system in accordance with another embodiment of the present invention.
Figure 3:
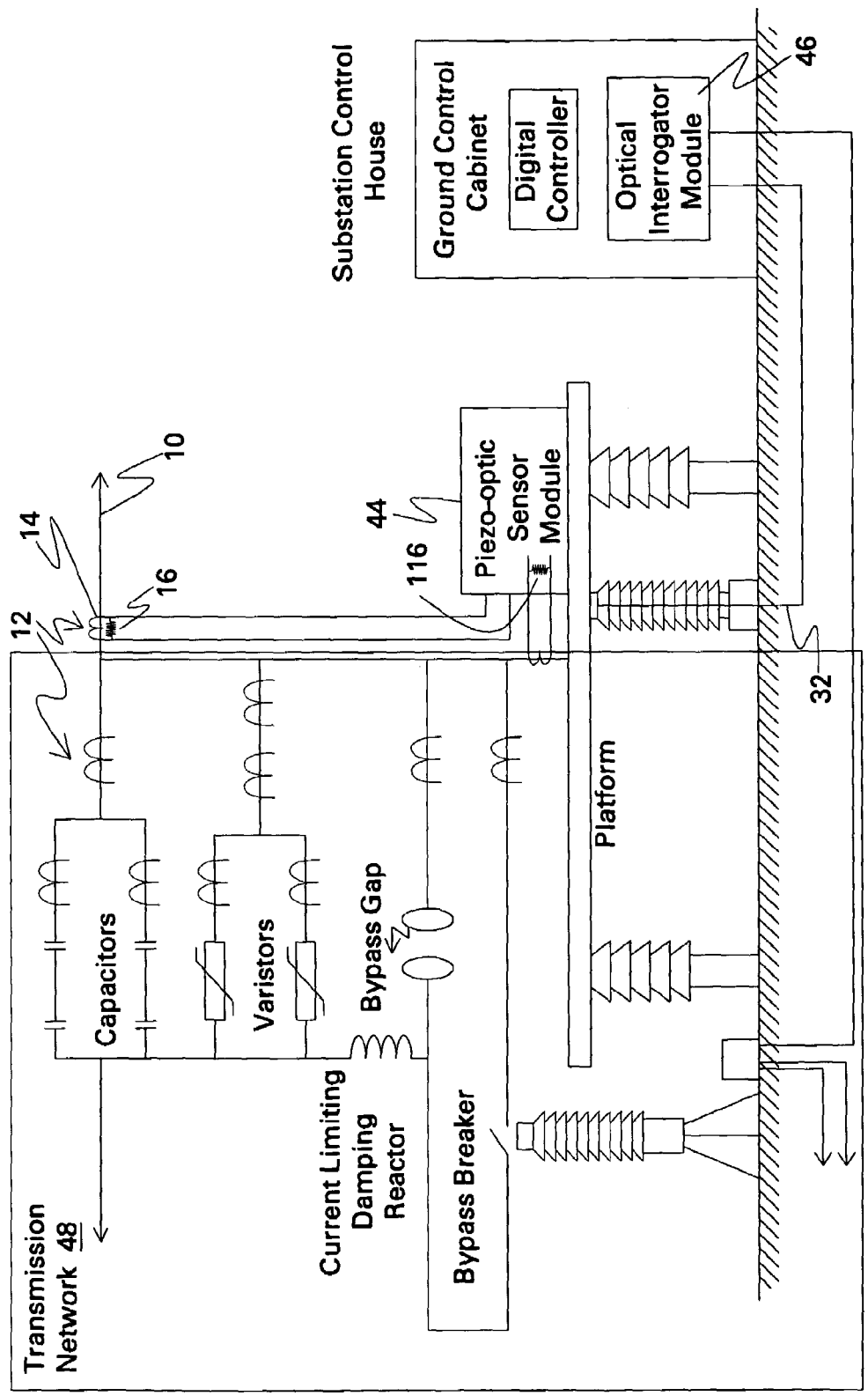
FIG. 3 is a schematic view of a reactive compensation system incorporating an embodiment of the optically interrogated current sensor.

Embodiments of the present invention relate to optically interrogated, high voltage current sensors. In one embodiment of the present invention, a current transformer (CT) 12, isolated from ground potential and mounted to a conductor 10, is used to measure current flowing in a conductor 10 at line voltage. CT 12 typically comprises a low voltage current transformer, including a secondary winding, such as a 600V class transformer, for example. The CT secondary 14 is coupled to a burden resistor 16 and the voltage drop across the burden resistor 16 is applied to a piezoelectric transducer (PZT) 18. Piezo-optic sensor 19 includes the PZT 18, and a first optical filter 20 with a first bandwidth, configured to have to a wavelength response and bonded to the PZT 18. Piezo-optic sensor 19 is located at the high-voltage conductor in one embodiment as shown in FIG. 1 or is alternatively located remote from conductor 10 as shown in FIG. 3. The burden resistor 16 is sized to provide sufficient driving voltage for the PZT 18. The PZT 18 expands and contracts in response to alternating current and transients and effectively modulates the wavelength response of the first optical filter bonded to it. A wideband light source 24 (that is, a source or collection of sources capable of emitting light over a range of wavelengths) at the ground is coupled into an optical fiber 32 and is used to optically interrogate the first optical filter 20 by providing an originating signal. The first optical filter 20 transmits (FIG. 1) or reflects (FIG. 2) a narrowband (frequency) of optical energy (the resulting data signal). In embodiments such as shown in FIG. 2 wherein reflected light is used as the resulting data signal, an originating splitter 34 typically has one end coupled to the light source and a second end coupled to transmit the resulting data signal. Although the transmission type first optical filter is shown in the single sensor illustration of FIG. 1 and the reflection type first optical filter is shown in the multiple sensor illustration of FIG. 2, either filter arrangement can be used in single or multiple sensor embodiments.

As PZT 18 modulates the wavelength response of the first optical filter 20, the wavelength of the resulting data signal shifts, effectively performing frequency modulation (FM) in the optical domain. The resulting data signal is passed to a second optical filter 26 with a second bandwidth. Second optical filter 26 is chosen such that the amplitude of the filtered resulting data signal varies with wavelength of the resulting data signal. As the resulting data signal modulates in frequency around a specific wavelength, the filtered resulting data signal through the second optical filter 26 modulates in amplitude. This optical, amplitude-modulated signal is presented to a data signal photodetector 28 for conversion to an electrical signal. The electrical signal is passed to an instrumentation and control system 42 for further electronic processing to retrieve the sensed current information.

One non-limiting example of the first optical filter is a Bragg grating. Another non-limiting example of the first optical filter is a long period grating. Typically a Bragg grating consists of refractive index modulation along a portion of a fiber with a specified period. Fiber Bragg Gratings (FBGs) are based on the principle of Bragg reflection. When light propagates through periodically alternating regions of higher and lower refractive index, the light is partially reflected at each interface between those regions. A series of evenly spaced regions results in significant reflections at a single frequency while all other frequencies are transmitted. When a Bragg grating is used, the grating thus acts as a notch filter, which reflects light of a certain wavelength. Since the frequency, which is reflected, is dependent on the grating period, a small change in the length of the fiber can be detected as a frequency shift. More specifically, strain induced in the fiber changes the grating period, which alters the center frequency of the filter. Since the optical fiber is bonded to the PZT 18, the frequency shift in the reflected light is in proportion to the deformation of the PZT. This in turn is proportional to the voltage applied, which in turn depends on the current measured. Therefore, the shift in wavelength is proportional to the current flow in the conductor. Long period gratings are similar to fiber Bragg gratings in that a periodic change in refractive index is created in the fiber core. However, a long period grating has a period that is typically several orders of magnitude larger than the period of a fiber Bragg grating. The long period grating acts as a notch filter for transmitted light, with a wavelength response that can be modulated by applied voltage through the PZT. One alternative to fiber gratings, for example, is a Fabry-Perot in-fiber sensor, which reflects light strongly at several wavelengths. The pattern of reflected light is affected by the width of the Fabry-Perot cavity. This pattern can be modulated by applied voltage through the PZT.

One non-limiting example of the second optical filter is a chirped grating. Typically in a chirped grating, the grating spacing differentially changes along the length of the grating. The amplitude of the signal filtered through the grating varies as the wavelength of the signal varies, effectively performing amplitude modulation of the input optical signal. Another non-limiting example of the second optical filter is a broadband filter. Typically such an optical filter has a non-zero slope region at the edge of the bandwidth in its transmission or reflection spectrum. If the first and second optical filters are so configured that the wavelengths of light emerging from the first optical filter and incident on the second optical filter, fall along the non-zero slope region of the second optical filter in the reflection or transmission spectrum, then the signal emerging from the second optical filter will modulate in amplitude as the wavelength shifts up and down the non-zero slope region. Another non-limiting example of a second optical filter is an optical filter whose transmission or reflection spectral envelope overlaps partially with the transmission or reflection spectral envelope of the first optical filter. As the spectral envelope of the first optical filter varies due to variation in the sensed current, the extent of overlap varies, leading to variation in amplitude of the incident light transmitted or reflected by the second optical filter.

To further refine the signal analysis, an optional receiving splitter 36 (FIG. 2) can be used. Receiving splitter 36 is configured to couple the resulting data signal from the first optical filter to the second optical filter 26 and to a reference signal photodetector 30. Differential amplifier 40 is configured to obtain the difference in signals obtained by data signal photodetector 28 (the filtered portion of the resulting data signal) and reference signal photodetector 40 (the unfiltered portion of the resulting data signal).

The above-described embodiments were primarily described in terms of a single CT, resistor, and Piezo-optic sensor for purposes of example, however, each system may include one or more of each such elements and "a" as used herein is intended to mean "at least one." When a plurality of CTs are used, such CTs may conveniently share a common optical fiber 32. In the reflective example of FIG. 2, first optical filter 20 comprises a reflective optical filter, and optical fiber 32 is coupled to originating splitter 34 having one end for coupling to the light source 24 for providing the originating optical signal, and a second end coupled to a wavelength demultiplexer 38. The signal is used to optically interrogate the first optical filters 20 bonded to the piezoelectric transducers 18. At wavelength demultiplexer 38, the multiplexed data signal is demultiplexed and the separated signals are passed on to the respective ones of a plurality of receiving splitters 36. The receiving splitters 36 are configured to couple the resulting data signal to the respective second optical filter 26 and to the respective reference signal photodetector 30. The second filter 26 is chosen such that the amplitude of the filtered signal varies with the wavelength of the signal. As the signal modulates in frequency around a specific wavelength, the filtered signal through the second optical filter 26 modulates in amplitude. This optical, amplitude-modulated data signal is presented to a data signal photodetector 28 for conversion to an electrical signal. The reference data signal is passed onto a reference signal detector 30. The use of the reference signal ensures that the observed amplitude variations in the data signal are due only to the current signal of interest. The outputs of the data signal photodetector 28 and the reference signal photodetector 30 are compared at a differential amplifier 40. The amplified difference signal is passed to instrumentation and control system 42 for further electronic processing to retrieve the sensed current information.

In another embodiment of the present invention, particularly applicable in reactive compensation systems for power transmission networks 48, several low-voltage (600V class) current transformers (CT) 12, completely isolated from ground potential are mounted at several points on conductors 10 in a transmission network 48 (FIG. 3). Each CT secondary 14 is coupled to a burden resistor 16 or 116 and the voltage drop across the burden resistor coupled to a piezo-optic sensor in a piezo-optic sensor module 44 located on a platform. Burden resistor 16 or 116 may be situated either inside or outside the module housing. The optical interrogator module 46 interrogates the piezo-optic sensors by sending an originating broadband signal along at least one optical fiber 32. Each piezo-optic sensor, including a piezoelectric transducer and a first optical filter with a first bandwidth, is configured to respond in different wavelength regions. The sensor responds to changes in current causing the center frequency of the filter to shift. The optical interrogator module 46, from at least one optical fiber 32, receives the resulting optical data signal. The optical data signal originating from different piezo-optic sensors are demultiplexed by demultiplexers, filtered through second optical filters with a second bandwidth and converted to electric signals by photodetectors housed in the optical interrogator module 44. The electrical signal is further processed and the information on current flow at various points on the network is passed on to a controller to enable dynamic control of the power flow in the system.

In an embodiment, which may be an alternative or used in combination with the frequency-multiplexing embodiment, a time division-multiplexing scheme could be used. In this embodiment, reflected or transmitted signals from the various filters could be resolved by observing the signals at different times. Since the gratings are separated in space on the same fiber, the time of arrival of reflected or transmitted signals will be different for each CT.

The previously described embodiments of the present invention have many advantages, including being low cost and being applicable in systems where simultaneous monitoring of current flow through several points on a conductor is required. The optical interrogation of the current sensor in the present invention is simple and avoids the complexities involved in optical current sensors exploiting the Faraday or Kerr effect. The optically interrogated current sensors of the present invention would be useful in monitoring current flow in complex transmission networks and in high voltage equipment.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for obtaining currents in high voltage environments, comprising:
    a current transformer for sensing current flowing in a conductor, the current transformer including a secondary winding;
    a burden resistor coupled to the secondary winding;
    a piezo-optic sensor coupled to the burden resistor, the piezo-optic sensor including a piezoelectric transducer, an optical fiber and a first optical filter with a first bandwidth; and
    an optical interrogator coupled to the optical fiber, the optical interrogator configured for sending a broadband originating signal to the first optical filter and receiving a wavelength modulated resulting data signal corresponding to a sensed current from the first optical filter, the optical interrogator comprising a second optical filter with a fixed second bandwidth for filtering the resulting data signal to generate an amplitude modulated resulting data signal corresponding to the sensed current, the first bandwidth and the second bandwidth at least partially overlapping.

2. The current sensing system of claim 1, wherein the optical interrogator further comprises a broadband light source for providing the originating signal.

3. The current sensing system of claim 1, wherein the first optical filter comprises a grating.

4. The current sensing system of claim 3, wherein the grating comprises a Bragg grating.

5. The current sensing system of claim 3, wherein the grating comprises a long period grating.

6. The current sensing system of claim 1, wherein the first optical filter comprises a Fabry Perot in-fiber cavity.

7. The current sensing system of claim 1, wherein the second optical filter comprises a grating.

8. The current sensing system of claim 7, wherein the second optical filter comprises a chirped grating.

9. The current sensing system of claim 1, wherein the second optical filter comprises a broadband filter.

10. The current sensing system of claim 9, wherein an overlap of the first and second bandwidths is in a non-zero slope region in the transmission or reflection spectrum of the second optical filter.

11. The current sensing system of claim 1, wherein the first optical filter comprises a transmissive optical filter.

12. The current sensing system of claim 1, wherein the optical interrogator further comprises a data signal photodetector for converting the amplitude modulated resulting data signal into an electrical signal.

13. The current sensing system of claim 12, further comprising process and control instrumentation for using the electrical signal to obtain the currents.

14. The current sensing system of claim 12, further including a reference signal photodetector, and wherein the optical interrogator further includes a receiving splitter configured to couple the wavelength modulated resulting data signal to the second optical filter and to the reference signal photodetector.

15. The current sensing system of claim 14, wherein the optical interrogator includes a differential amplifier, the differential amplifier configured to compare power outputs of the data signal photodetector and the reference signal photodetector.

16. The current sensing system of claim 1, wherein the first optical filter comprises a reflective optical filter.

17. A system for obtaining currents in high voltage environments, comprising:
    a plurality of current transformers for sensing current, each including a secondary winding;
    a plurality of burden resistors, each coupled to a respective one of the secondary windings;
    an optical fiber;
    a plurality of piezo-optic sensors, each coupled to a respective one of the plurality of burden resistors and each including the optical fiber, a piezoelectric transducer and a first optical filter with a first bandwidth; and
    an optical interrogator coupled to the optical fiber, the optical interrogator configured for sending a broadband originating signal to the plurality of first optical filters and receiving wavelength modulated resulting data signal from the plurality of first optical filters, the optical interrogator comprising a plurality of second optical filters with a respective fixed second bandwidth for filtering the wavelength modulated resulting data signal to generate a plurality of amplitude modulated resulting data signals, bandwidths of respective first and second optical filters at least partially overlapping.

18. The current sensing system of claim 17, wherein the optical interrogator further comprises at least one broadband light source for providing the originating signal.

19. The current sensing system of claim 17, wherein at least two of the first optical filters have different frequency responses.

20. The current sensing system of claim 17, wherein at least one of the first optical filters comprises a grating.

21. The current sensing system of claim 20, wherein the grating comprises a Bragg grating.

22. The current sensing system of claim 20, wherein the grating comprises a long period grating.

23. The current sensing system of claim 17, wherein at least one of the first optical filters comprises a Fabry Perot in-fiber cavity.

24. The current sensing system of claim 17, wherein at least one of the second optical filters comprises a grating.

25. The current sensing system of claim 17, wherein at least one of the second optical filters comprises a chirped grating.

26. The current sensing system of claim 17, wherein at least one of the second optical filters comprises a broadband filter.

27. The current sensing system of claim 26, wherein an overlap of the first and second bandwidths is in a non-zero slope region in the transmission or reflection spectrum of the second optical filter.

28. The current sensing system of claim 17, wherein the first optical filters comprise transmissive optical filters.

29. The current sensing system of claim 17, wherein the optical interrogator includes a plurality of data signal photodetectors for converting the amplitude modulated resulting data signal into electrical signals.

30. The current sensing system of claim 29, further comprising process and control instrumentation for using the electrical signals to obtain currents.

31. The current sensing system of claim 29, wherein the optical interrogator further comprises a plurality of reference signal photodetectors and a plurality of receiving splitters, wherein the plurality of receiving splitters are configured to couple the wavelength modulated resulting data signal to the plurality of second optical filters and to the plurality of reference signal photodetectors.

32. The current sensing system of claim 17, wherein the first optical filters comprise reflective optical filters.

33. The current sensing system of claim 32, wherein the optical interrogator further comprises an optical wavelength demultiplexer to separate optical signals comprising the wavelength modulated resulting data signal originating from the plurality of first optical filters, the optical wavelength demultiplexer configured to couple the separated wavelength modulated resulting data signal into a plurality of receiving splitters.

34. The current sensing system of claim 32, wherein the optical interrogator includes a plurality of differential amplifiers, the differential amplifiers configured to compare power outputs of respective data signal and reference signal photodetectors.

35. The current sensing system of claim 17, wherein the first optical filters are separated by sufficient space along the optical fiber for time division multiplexing of the resulting data signal.

36. A system for obtaining currents in high voltage environments, comprising:
 a plurality of current transformers for sensing current, the current transformers each including a secondary winding;
 a plurality of burden resistors coupled to the respective ones of the plurality of secondary windings of the secondary transformers;
 a piezo-optic sensor module comprising a housing and a plurality of piezoelectric transducers, each transducer coupled to a respective one of the plurality of burden resistors; and
 an optical interrogator module coupled to the piezo-optic sensor module, wherein the optical interrogator is configured to interrogate the piezo-optic sensor module using a broadband originating signal, amplitude modulate a data signal from the piezo-optic sensor module and detect an amplitude modulated data signal.

37. The system of claim 36 wherein the plurality of burden resistors are situated within the housing.

38. The system of claim 36 wherein the plurality of burden resistors are situated outside the housing.

39. The current sensing system of claim 36, wherein the piezo-optic sensors each comprise a piezoelectric transducer, an optical fiber and a first optical filter with a first bandwidth.

40. The current sensing system of claim 36, wherein the optical interrogator module comprises at least one broadband light source for sending the broadband originating signal to a plurality of first optical filters and receiving a wavelength modulated resulting data signal from the plurality of first optical filters and a plurality of second optical filters with a respective second bandwidth for filtering the wavelength modulated resulting data signal to generate a plurality of amplitude modulated resulting data signals, the bandwidths of respective first and second optical filters at least partially overlapping.

41. The current sensing system of claim 40,
 wherein the optical interrogator module further comprises data signal photodetectors coupled to the plurality of second optical filters,
 reference signal photodetectors,
 receiving splitters configured to couple the resulting data signal to the plurality of second optical filters and to the reference signal photodetectors,
 an optical wavelength demultiplexer to separate optical signals comprising the wavelength modulated resulting data signal originating from the plurality of first optical filters, the optical wavelength demultiplexer configured to couple the separated resulting data signal into the plurality of receiving splitters, and
 a plurality of differential amplifiers, the differential amplifiers configured to compare power outputs of respective data signal and reference signal photodetectors.

42. The current sensing system of claim 36, wherein the piezo-optic sensors each comprise a piezoelectric transducer, a first optical filter with a first bandwidth, the first optical filters separated by sufficient space along the optical fiber for time division multiplexing of the resulting data signal.

\* \* \* \* \*